United States Patent [19]

Rye

[11] Patent Number: 5,079,038
[45] Date of Patent: Jan. 7, 1992

[54] HOT FILAMENT CVD OF BORON NITRIDE FILMS

[75] Inventor: Robert R. Rye, Albuquerque, N. Mex.

[73] Assignee: The United States of America as represented by the United States Department of Energy, Washington, D.C.

[21] Appl. No.: 592,457

[22] Filed: Oct. 5, 1990

[51] Int. Cl.$^5$ .............................................. C23C 16/34
[52] U.S. Cl. .............................. 427/248.1; 427/255; 427/314
[58] Field of Search ...................... 427/248.1, 255, 314; 118/724, 725

[56] References Cited

U.S. PATENT DOCUMENTS 4,481,232 11/1984 Olson ..................................... 427/51
4,900,526 2/1990 Matsuda et al. ...................... 423/290

FOREIGN PATENT DOCUMENTS 61-174378 8/1986 Japan .
61-266576 11/1986 Japan .

OTHER PUBLICATIONS

K. Nakamura, "Preparation and Properties of Amorphou Boron Nitrode Films . . . Deposition", Electro-Chem. Soc., vol. 132, Jul. 1985, pp. 1757–1762.
W. Schmolla and H. L. Hartnagel, "Amorphous BN Films . . . Applications", Solid-State Electronics, vol. 26, No. 10, 1983, pp. 931–939.
M. D. Wiggins and C. R. Aita, "Radio Frequency Sputter Deposited Boron Nitride Films", J. Vac. Sci. Technol. A2(2), Apr.–Jun. 1984, pp. 322–325.
H. Matsumura, "Methods and Apparatus for Catalytic Chemical Vapor Deposition", Japanese Patent JP63040314, Chem. Abstracts, CA109(10):83940z, 1988.

Primary Examiner—Shrive Beck
Assistant Examiner—Roy V. King
Attorney, Agent, or Firm—George H. Libman

[57] ABSTRACT

Using a hot filament ($\approx 1400°$ C.) to activate borazine ($B_3N_3H_6$) molecules for subsequent reaction with a direct line-of-sight substrate, transparent boron ntiride films as thick as 25,000 angstroms are grown for a substrate temperature as low as 100° C. The minimum temperature is determined by radiative heating from the adjacent hot filament. The low temperature BN films show no indication of crystallinity with X-ray diffraction (XRD). X-ray photoelectron spectra (XPS) show the films to have a B:N ratio of 0.97:1 with no other XPS detectable impurities above the 0.5% level. Both Raman and infrared (IR) spectroscopy are characteristic of h-BN with small amounts of hydrogen detected as N-H and B-H bands in the IR spectrum. An important feature of this method is the separation and localization of the thermal activation step at the hot filament from the surface reaction and film growth steps at the substrate surface. This allows both higher temperature thermal activation and lower temperature film growth.

8 Claims, 7 Drawing Sheets

HOT FILAMENT CVD
Film Growth
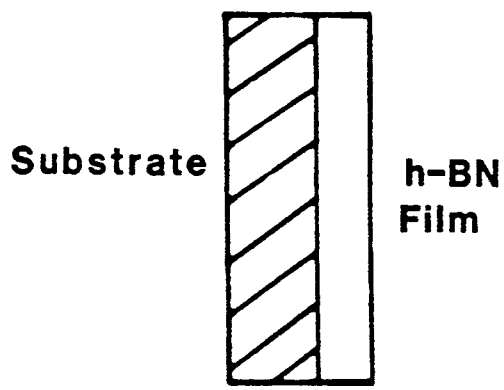
Thermal Activation
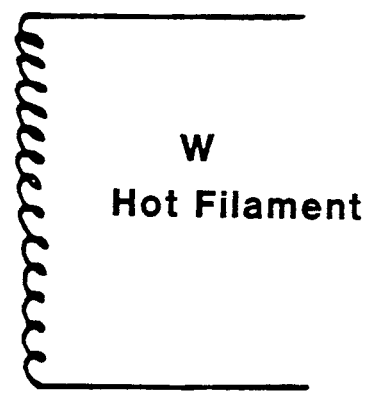
Figure 1(A)
Figure 1(B)

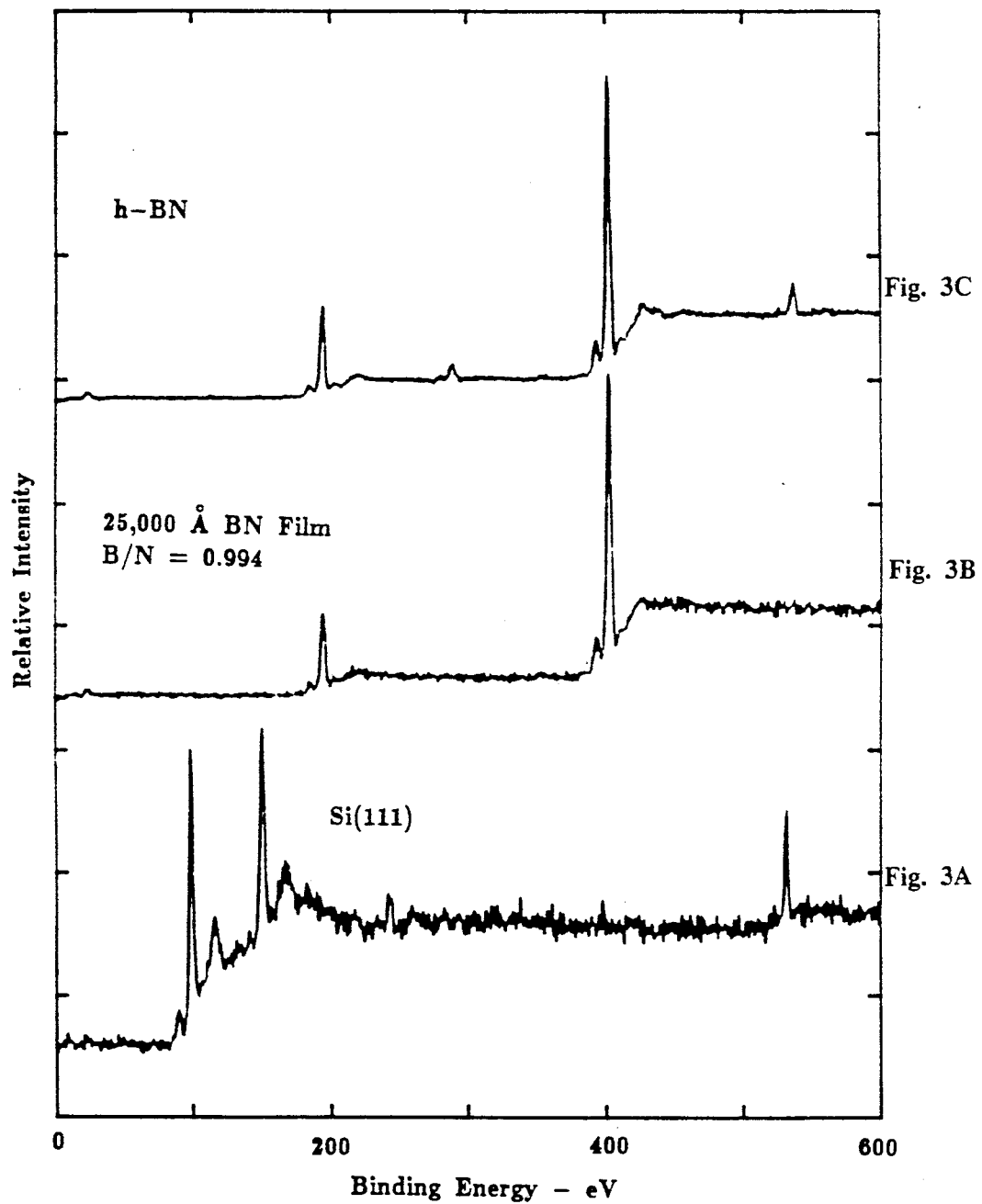

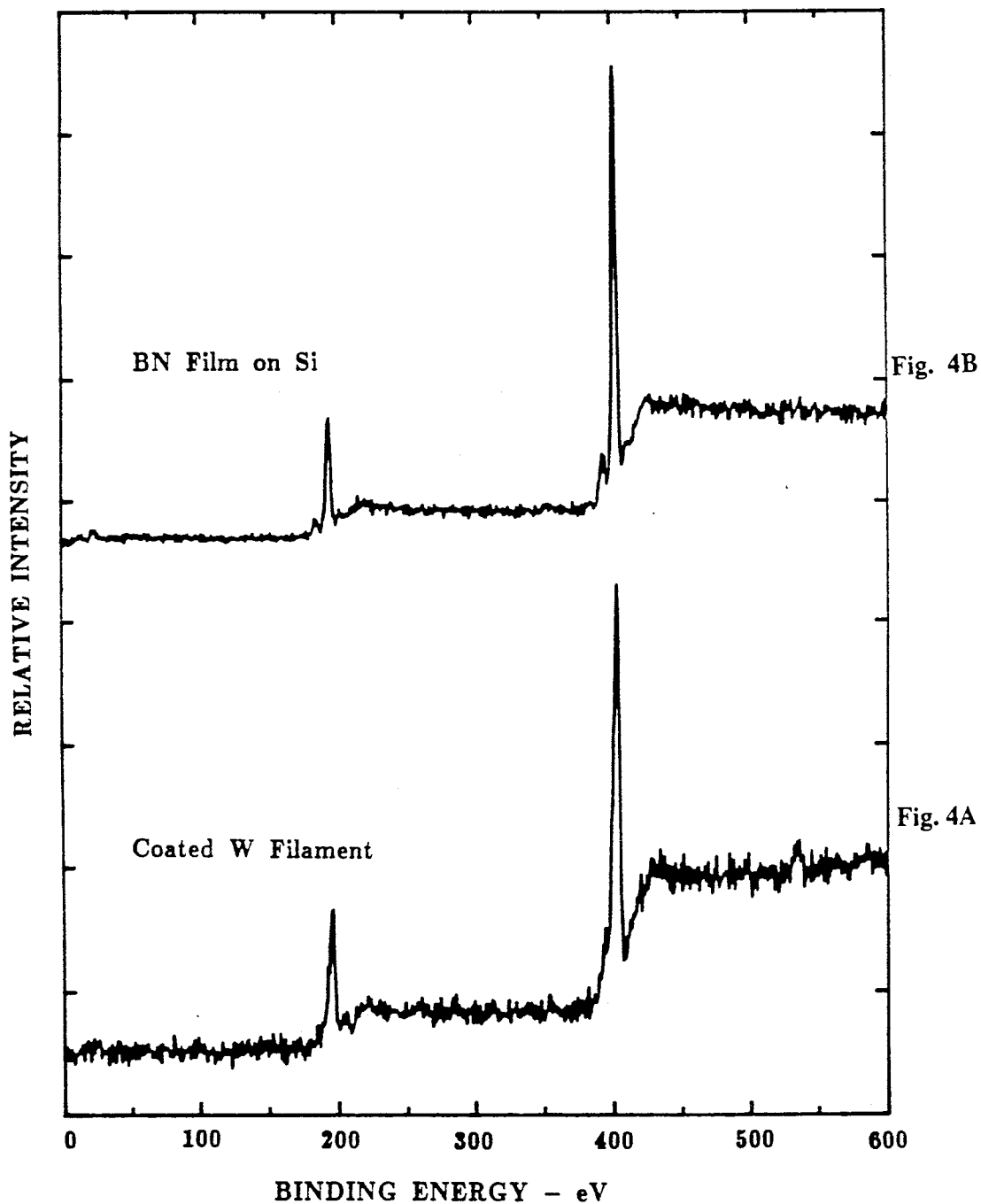

HOT FILAMENT CVD OF BORON NITRIDE FILMS

BACKGROUND OF THE INVENTION

1. Field of the Invention

The present invention relates to a method for forming boron nitride coatings. More specifically, the present invention relates to forming a boron nitride film having a low amount of impurities on a substrate.

2. Description of Related Art

Chemical vapor deposition (CVD) would be particularly attractive for BN film formation, and considerable effort has occurred in this direction using various gas mixtures: $B_2H_6$ and $NH_3$ (S. Hirano et al, *J. Am. Ceram. Soc.* 72. 66(1989)); $BCl_6$ and $NH_3$ (S. Motojima et al, *Thin solid Films*, 88, 269(1982)); $B_{10}H_{14}$ and $NH_3$ (K. Nakamura, *J. Electrochem. Soc.*, 132, 1757(1985)); direct pyrolysis of borazine (S. Hirano et al, supra); and more complex BN containing molecules (W. Schmolla et al, *Solid-State Electronics*, 26 931(1983)). However, these reactions are highly complex and the resulting films strongly dependent on the gas composition, the temperature and reactions occurring at the wall (S. Hirano et al, supra).

A potentially interesting precursor for BN film production is the borazine ($B_3N_3H_6$) molecule. Borazine is isostructural and isoelectron with benzene, and contains the exact B/N ratio required for BN with only hydrogen as a potential impurity. The fact that borazine contains the same 6-membered ring structure as the hexagonal phase of boron nitride, h—BN, is not important since the formation of h—BN from borazine requires ring opening reactions.

There are a number of applications where it would be very desirable to use a thin coating of BN as a protective coating. One area is in the use of materials such as BN as a passivation layer for high-frequency electronic devices based on materials such as GaAs. Schmolla et al (supra) pointed out that BN is an excellent candidate for device application but that the following deposition conditions are dictated by the semiconductor: 1) low substrate temperature, 2) low heat of formation, and 3) low energy incident particles. These requirements would tend to eliminate ion beam or plasma techniques and place strong restrictions on normal chemical methods of film formation given the problems with residence time of surface species. In general, one increases the rate of surface chemical reactions by increasing the temperature, but the same increase in temperature leads to a decreased residence time on the surface for the reacting species. The result of this competition between increased reaction rate and decreased residence time gives a general phenomenon in surface chemical reactions of maximum in the overall rate vs. temperature.

It has been shown specifically for BN that chemical vapor deposition (CVD) requires a temperature of over 800° C. for the production of stoichiometric BN, and moreover, that a factor of 5 increase occurs in both the N/B ratio and the deposition rate in going from 350° C. to 800° C; above 800° C. both decrease with increasing temperature (Nakamura et al, supra). In a particularly clear example of the composition and temperature dependence, when $B_{10}H_{14}$ and $NH_3$ were used, a ratio of 20:1 for $NH_3:B_{10}H_{14}$ is required for a N:B ratio of 1:1 in the resulting film (Nakamura et al, supra). In general, this need for a high substrate temperature is a characteristic of CVD processes in which the reaction occurs on a heated substrate. A basic problem is to increase the chemical activity of the reactant species without increasing the substrate temperature. In normal CVD the increased chemical activity is produced by the temperature of the gas; this also disadvantageously heats the sample.

A method for catalytic chemical vapor deposition which entails deposition at a substrate temperature between room temperature and 500° C. with decomposition of a source gas which is brought into contact with a catalyst superheated at 800°–2000° C. is disclosed by Matsumura (Chem. Abs. 109(10):83940z). It is disclosed that amorphous silicon and silicon nitride films are among the films which may be formed by this method. Other relevant disclosures by Matsumura include H. Matsumura, *Jap. J. Appl. Phys.* 25, L949(1986); H. Matsumura et al, *J. Appl. Phys.* 64, 6505(1988); H. Matsumura, *J. Appl. Phys.*, 65, 4396(1989); H. Matsumura, *J. Appl. Phys.*, 28, 2157(1989); and H. Matsumura, *J.Appl. Phys.*, 66, 3612(1989). All of these disclosures fail to disclose a method for forming a boron nitride film on a substrate.

SUMMARY OF THE INVENTION

Therefore, it is an object of the present invention to provide a method for coating a boron nitride film on a substrate.

It is a further object of the present invention to provide a method for forming a boron nitride film on a substrate wherein the substrate is maintained at a low temperature.

It is another object of the present invention to provide a boron nitride coating having a very low amount of impurities.

It is still another object of the present invention to provide a method for forming a boron nitride coating which employs as a precursor a non-toxic liquid easily handled in vacuum such as borazine.

It is yet another object of the present invention to provide a method for coating a boron nitride film on a substrate wherein the thermal activation step at a hot filament is separated from the surface reaction and film growth steps at the substrate surface.

It is still a further object of the present invention to provide a low energy plating technique which results in the deposition of a very pure BN film on a substrate.

The foregoing objects and other are accomplished in accordance with the present invention, generally speaking, by providing a method for coating a substrate with a boron nitride film which includes providing a substrate and a hot filament in a gas chamber; and introducing borazine gas into the gas chamber so as to heat said borazine gas with said hot filament and deposit a boron nitride film on the substrate.

Further scope of the applicability of the present invention will become apparent from the detailed description and drawings provided below. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention is further illustrated in the accompanying drawings wherein:

FIGS. 1(A) and 1(B) are schematic drawings of the general system used to employ the method of the present invention;

FIGS. 3(A), 3(B) and 3(C) are a series of x-ray photoelectron spectra (XPS) for each of a Si(lll) substrate, a BN film of 25,000 angstroms and a sample of bulk h—BN;

FIGS. 4(A) and 4(B) show the XPS spectra for a BN film grown on a silicon substrate and the BN film formed on a hot filament;

DETAILED DESCRIPTION OF THE INVENTION

Figures 2A, 2B:
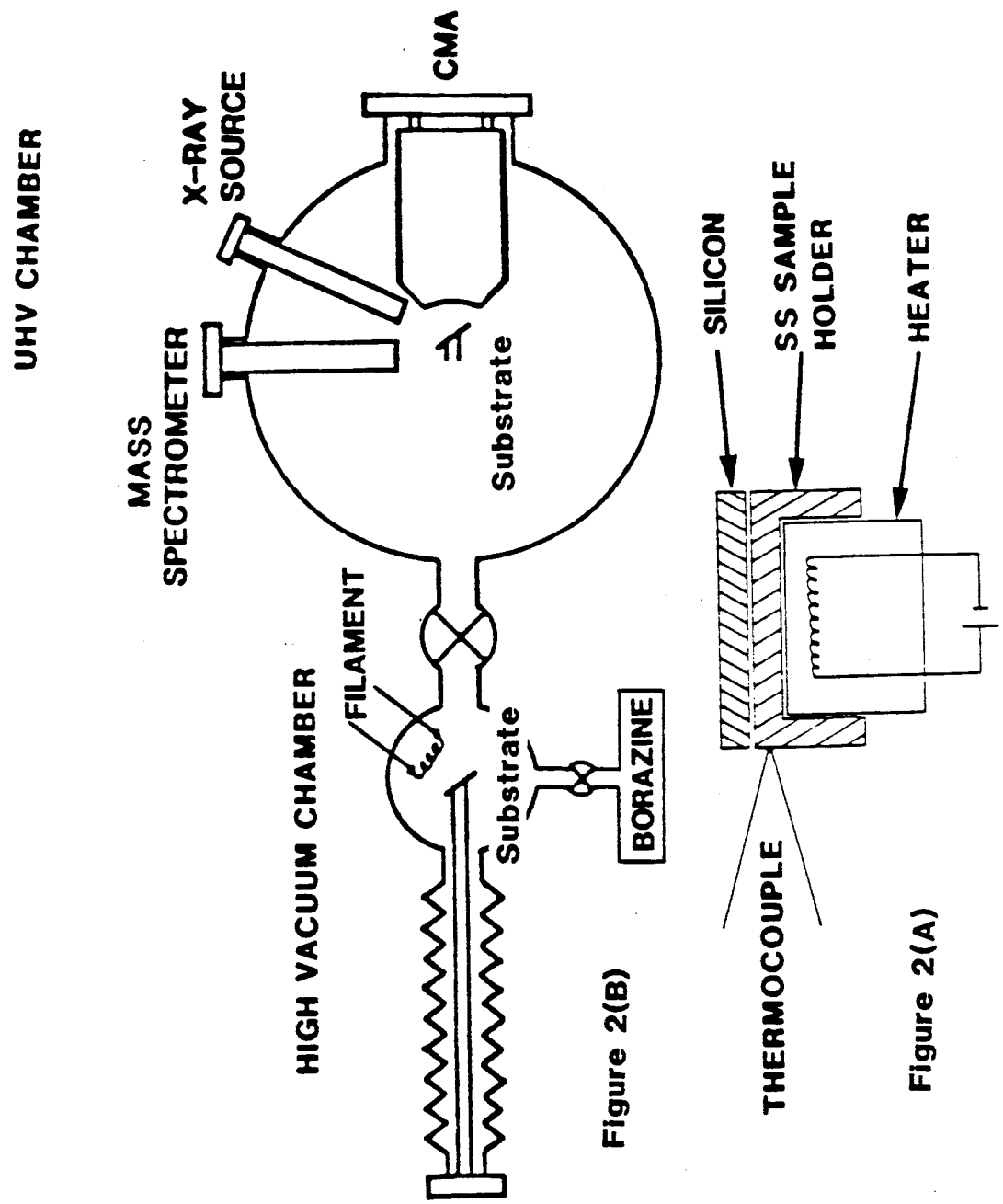
FIGS. 2(A) and 2(B) are schematic drawings of an experimental system used to employ the method of the present invention.

The present invention includes a modification of the CVD process in which the thermal activation process occurs at the surface of a hot filament placed in direct line-of-sight to the substrate where film growth takes place. The present invention is generally directed to a method for coating a substrate with a boron nitride film which includes the steps of providing a substrate and a hot filament in a gas chamber; and introducing borazine gas into the gas chamber so as to heat the borazine gas with the hot filament and deposit a film of boron nitride on the substrate, as well as to the boron nitride film formed thereby. Since only the filament is heated, wall reactions are eliminated or greatly reduced, and sample heating is reduced to that occurring as a result of the nearby hot filament. Although the residence time is short on the hot filament, it is sufficient for the molecule to pick up enough energy to lead to bond breaking and/or vibrational excitation. Thus, the active species arriving at the substrate have thermal energies but are highly chemically active. Using the hot filament CVD technique of the present invention with borazine gas transparent films of h—BN as a thick as about 25,000 angstroms have been grown for substrate temperatures between 100° C. and 400° C.

An advantage associated with the method of the present invention is the separation and localization of the thermal activation step at the hot filament from the surface reaction and the film growth steps at the substrate surface. This allows for low temperature conditions more favorable to a wide variety of substrates. For example, the BN film may be used as a passivation layer for high-frequency electronic devices based on semiconductor materials such as GaAs which are accommodated by the lower substrate temperatures. Further, the method of the present invention is a low energy plating technique which results in the deposition of a very pure BN film coating in contrast to other high energy plating techniques, such as plasma deposition wherein a crucible of a plating material is blasted with a plasma arc which causes other undesired ions to be generated and deposited on the substrate.

The boron nitride film formed according to the present invention may be formed on a wide variety of substrates including but not limited to metals such as aluminum, semiconductors such as silicon and germanium, insulators such as quartz, and other materials such as KBr. There are no significant limitations with regard to the substrate employed other than it must be capable of being subjected to the temperatures involved in the method of the present invention.

The use of borazine gas as a precursor in the method of the present invention is advantageous in that the molecule has the stoichiometry of BN with only a minimum excess of hydrogen. In addition, the molecule is a non-toxic, high vapor precursor liquid easily handled in a vacuum. In the method of the present invention borazine gas pressures may generally be between about 0.010 torr and 1.0 torr for a filament to substrate distance of about 1 cm to 3 cm.

Using a hot tungsten filament in the presence of borazine gas and in direct line-of-sight with a substrate in the method of the present invention, it is possible to produce transparent films as thick as 25,000 angstroms and for substrate temperatures as low as 100° C. Generally, if a filament is to be heated by passing an electric current through it, the filament must be of a current conducting material, such as a metal. Other metals which may be used for the hot filament include, for example, platinum, palladium, molybdenum, and other metals coated with aluminum oxide, silicon carbide, etc. Additional metals which may be employed as the hot filament are those which do not easily form a metallic boride. The hot filament is heated to a temperature of about 1000° to 800° C., preferably about 1400° to 1600° C . The filament is preferably in the form of a coil to increase surface area and should be formed in a shape corresponding to the surface of the substrate to be coated.

Substrate operating temperatures for the method of the present invention are generally in the range of 100° C. and higher, preferably about 100° C. to 400° C., in order to adequately deposit the BN film on the substrate. Substrate temperatures higher than 400° C. may be necessary if greater BN film crystallinity is desired.

An example of a general system in which the method according to the present invention may be employed is for coating flat substrates shown in the schematic drawings of FIGS. 1(A) and 1(B). FIG. 1(A) shows film growth of a h—BN type boron nitride film on a substrate in accordance with the hot filament CVD method of the present invention. FIG. 1(B) shows a coiled tungsten (W) hot filament used in this method. Borazine gas is introduced at an appropriate pressure and is thermally activated at the hot filament before being deposited on the substrate. In general, because of the line-of-sight character of the method of the present invention, the filament is shaped to correspond to the shape of the substrate to be coated. For example, to coat a circular section of a cylinder, the filament would be formed into a circle around the cylinder, while to coat the length of the cylinder, several filaments would be used with the filament axis parallel to the cylinder axis.

The films produced at the low temperatures in accordance with the present invention contain small amounts of hydrogen, have the stoichiometry of BN, have both Raman and IR spectra characteristic of h-BN, but show no indication of crystallinity with X-ray diffraction. The width of the Raman band is consistent with h—BN crystallinities whose size is too small for X-ray diffraction.

The films produced at the low temperatures according to the method of the present invention are characteristic of h—BN with extremely small crystalline size, a conclusion probably not surprising given the extremely low substrate temperatures during deposition. It has been shown previously (R.R. Rye et al, *J. Amer. Ceramic Soc.*, 73, 1409(1990)) that pyrolysis of borazinyl amine precursors leads to a material with the stoichiometry of BN with small amounts of H by temperatures as low as 300° C., but that temperatures of 1200° C. to 1600° C. are necessary to produce h—BN recognizable by X-ray diffraction. It appears that increased crystallinity occurs somewhere between the low temperatures (100° C. to $\approx$200° C.) employed for film growth and the >1400° C. filament temperature of the hot filament. Given the general reactivity of boron compounds towards water, the poorly consolidated nature of the low temperature films can be an important characteristic controlling their stability.

EXAMPLES

A schematic drawing of an experimental system for employing the method of the present invention is provided in FIGS. 2(A) and 2(B). The UHV portion in FIG. 2(B) contains a cylindrical mirror analyzer for XPS and Auger spectroscopy, and a quadruple mass analyzer for direct line-of-sight mass spectroscopy. Samples are clamped against the heater assembly as shown in FIG. 2(A), with the complete heater assembly suspended by 0.38 mm Ta wires. Since the thermocouple is spot welded to the sample holder, the sample temperature will be somewhat lower than recorded during the thermal transients due to limitations in heat transfer, but is expected to be a reasonable measure for steady state values. The maximum temperature reached with heating is approximately 400° C., and the minimum temperature (dependent on filament proximity) during film deposition is 100° C.

The complete sample assembly shown in FIG. 2(B) can be plugged into heating and temperature measurement stations in the UHV chamber, or transferred under vacuum to equivalent stations in the high vacuum portion of the system for high pressure reactions. In a typical example the sample is transferred to the UHV system for surface characterization and/or sputtering, transferred to a position immediately in front of the filament in the high vacuum system for film deposition, and then back to the UHV system for film characterization. Base pressures are $1 \times 10^{-6}$ torr in the high pressure system and $1 \times 10^{-9}$ to $1 \times 10^{-10}$ torr in the UHV portion. XPS survey spectra (0–1000 V BE) were obtained using 100 eV pass energy, and spectra of the individual XPS peaks were obtained using 50 eV pass energy.

For film deposition, borazine is typically admitted to a dynamic pressure of $\approx$0.1 torr and the filament heated to induce film growth. Filaments are constructed of coiled 0.13 mm tungsten wire, but the materials is apparently not important since the filaments rapidly become coated with a thick deposit of BN. Because of the thick coating on the filament, one cannot obtain accurate measure of the temperature. However, assuming the emissivity of 0.7 for h—BN, the indicated optical pyrometer temperature is $\approx$1400° C.

A small section of each sample was masked with 0.25 mm Ta foil in order to produce a step contrast between coated an uncoated sections for measurement of the film thickness using a Dektak model 3030 (Veeco Instruments Inc., Santa Barbara, CA) surface profile measuring system. The Raman spectrometer used was a conventional one. Transmission infrared spectra were obtained using a Cygnus-100 Fourier Transform (FT-IR) spectrometer. For the FT-IR measurements, films were deposited on KBr pellets that had been previously outgassed at $\approx$300° C. The outgassing was useful in removing interfering water absorption; after outgassing the contribution from water in or on the KBr pellet was small compared to any IR bands from the BN film, even after setting in the laboratory air for several days.

Borazine, supplied by Callery Chemical Co., Callery, PA, was vacuum distilled into glass ampules with metal valves for attachment to the vacuum system. Since borazine slowly decomposes at room temperature yielding hydrogen and an inorganic polymer, the sample was periodically frozen at liquid nitrogen temperature and pumped to remove excess $H_2$, and removed from the system for low temperature storage when not in use.

FIGS. 3(A)–3(C) contain a series of x-ray photoelectron spectra (XPS) which characterize the BN film growth: FIG. 3(A) is the Si(lll) substrate after sputtering and prior to film deposition, FIG. 3(B) the XPS spectra after deposition of 25,000 angstroms of BN, and FIG. 3(C) is the reference XPS spectrum from a sample of bulk h—BN which was freshly cleaved just prior to insertion into the vacuum system. For the film represented by spectrum 3(B), borazine was admitted to a dynamic pressure of $\approx$0.1 torr and the filament heated to roughly 1400° C. for 195 minutes. In the absence of the hot filament, an equivalent exposure of the Si(lll) surface to borazine leads to only small Bls and Nls XPS peaks superimposed on the Si spectrum. The sample was not heated during this time using the internal heater, although the sample (or sample block) reached a final temperature of $\approx$250° C.

Film quality equivalent to those in FIG. 3B are obtained for samples heated to over 400° C. and for films at temperatures as low as 100° C. The latter required moving the filament further from the sample with resulting slower film growth. At the borazine pressures employed, the growth rate is extremely sensitive to the filament to substrate distance. If the filament is moved too far from the substrate, the film growth can be effectively shut off, apparently by the activated molecules (and/or fragments) being deactivated by gas phase collisions before arriving at the substrate. At the pressures used here ($\approx$0.1 torr) the mean free path is very short; estimated to be in the range of $\approx$0.3 mm to $\approx$0.5 mm from the tables of mean free path given by Dushman (C.D. Wagner et al, *Scientific Foundations of Vacuum Technique*, John Wiley and Sons, New York, N.Y., 1965).

In general no attempt was made to sputter clean the surface or to anneal the surface since equivalent film growth was observed for surfaces that contained the native oxide layer as well as on native surfaces of quartz and KBr. For the samples prepared and then directly transferred back to the UHV chamber, there is little evidence for surface atoms other than B and N, although higher resolution XPS spectra covering limited binding energy ranges with longer data accumulation times shows that the surface contains $\approx$0.5% oxygen. These surface concentrations were obtained using atomic sensitivity factors given by Physical Electronics (C.D. Wagner et al, *Handbook of X-ray Photoelectron Spectroscopy*, Perkin-Elmer Corp., Eden Prairie, Minnesota, 1979), but in order to obtain a more accurate measure of the film stoichiometry, high resolution XPS spectra were obtained covering the Bls and Nls regions for the freshly deposited BN film, FIG. 3(B), and the freshly cleaved h—BN reference sample, FIG. 3(C). Using the N/B sensitivity ratio of 3.58 obtained (assuming a B:N atomic ratio of 1:1 for the reference sample) from ratios of the areas for the reference sample, the B/N atomic ratio for the 25,000 angstroms film represented by FIG. 3(B) is 0.994/1. Thus, one can conclude that impact of the borazine molecule with the hot filament thermally activates the molecule for subsequent reaction at the substrate surface and produces a film with the exact stoichiometry of BN with negligible quantities of other XPS detectable impurities.

That the hot filament serves to simply thermally activate the borazine molecules is suggested by the fact that an equivalent BN film grows on the surface of the W filament. FIG. 4(A) contains the XPS spectrum from a used filament directly compared to that of the film deposited on Si, FIG. 4(B). The two are identical. Films of BN grow on both the filament and on the substrate, but only the filament is heated. After the initial stages with a new filament, the process is essentially one of heating a filament of BN to activate the borazine molecules for subsequent reaction at the substrate surface. This is basically a CVD process in which the thermal activation step is separated from the surface reaction step.

Figure 5:
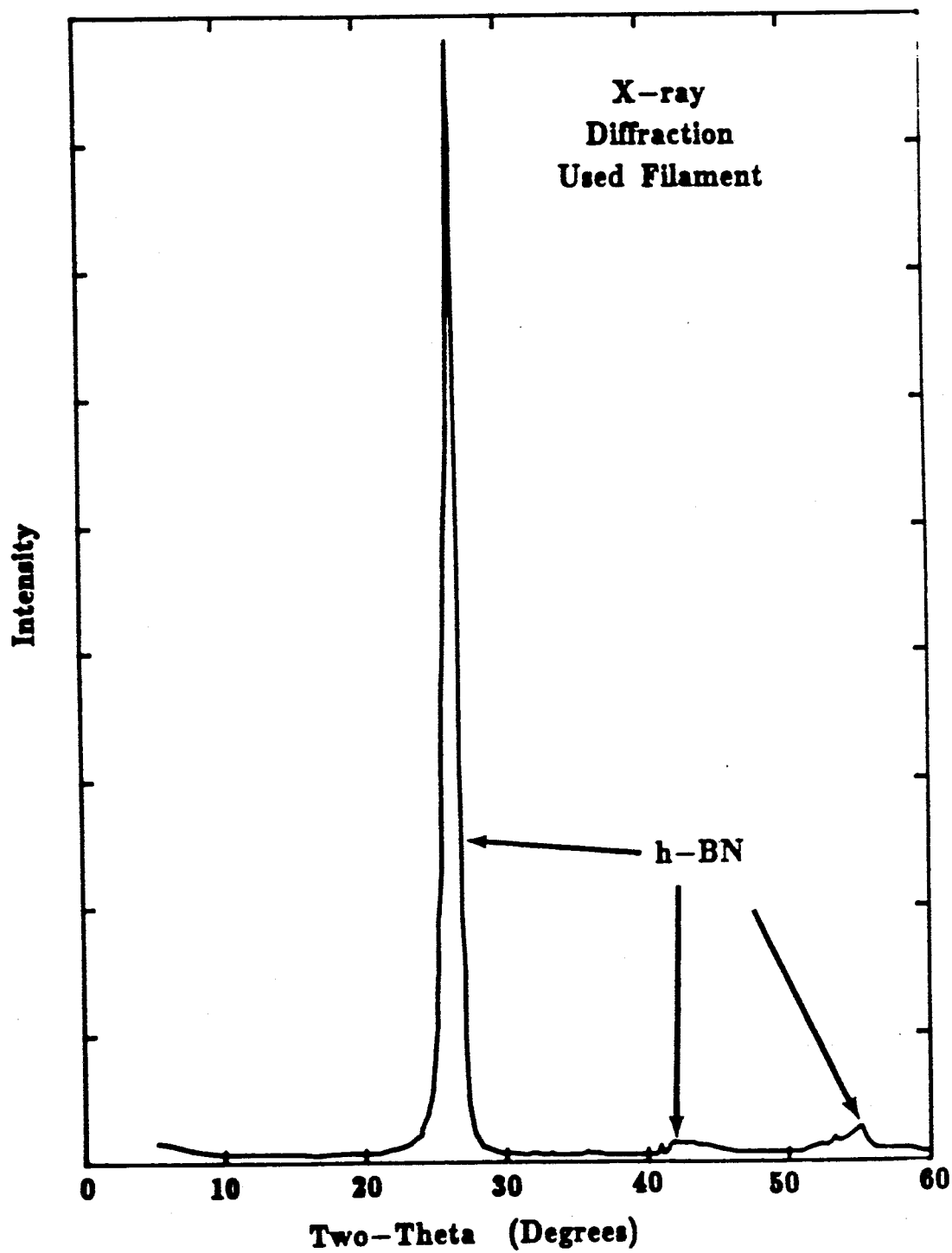
FIG. 5 is the X-ray diffraction pattern of a BN coating on the hot filament.

While the films clearly have the stoichiometry of BN, XPS cannot establish its exact form. One should expect no long range order in the films grown at such low temperature, and we have seen no indication of long range order in X-ray diffraction. In contrast, the BN coating on the filament (operated in excess of 1400° C.) gives the X-ray diffraction pattern of h—BN given in FIG. 5.

Figure 6:
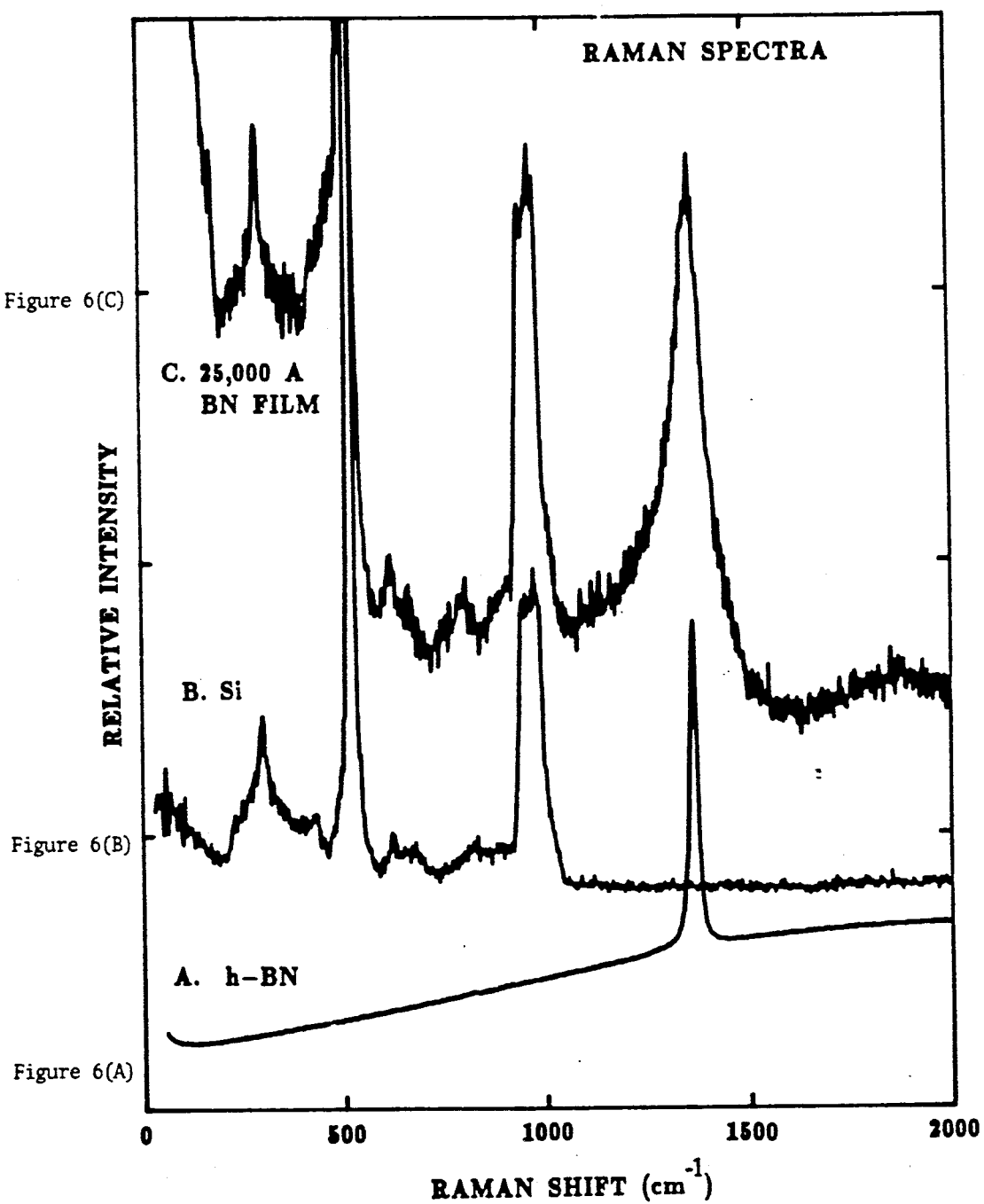
FIGS. 6(A), 6(B) and 6(C) show the Raman spectra for pyrolytic h—BN, a silicon substrate and a silicon substrate coated with a BN film of 25,000 angstroms.

While no indication of long range order is observed in the low temperature films, both Raman and infrared spectroscopy, which require much less order, are consistent with h—BN. Illustrated in FIG. 6(C) is the Raman spectrum of the silicon substrate covered by same 25,000 angstroms film of BN as in FIG. 4. For comparison, FIG. 6(A) is the spectrum of a sample of pyrolytic BN with its single Raman peak at 1363 cm$^{-1}$ and FIG. 6(B) the spectrum of the silicon substrate with its numerous peaks, and with a wide featureless window around the expected wave number position of h—BN. All the features in FIG. 6(C) expected for the peak at 1360 cm$^{-1}$ are identical to those the substrate, FIG. 6(B), and the 1360 cm$^{-1}$ peak is within 3 cm$^{-1}$ of the single Raman band of h—BN, but considerably broadened (full width at half maximum of $\approx$93 cm$^{-1}$) due to the lack of long range order (R.J. Nemanich et al, Phys. Rev. B, 23, 6348(1981)). The single Raman active band has been observed at 1370 cm$^{-1}$ and assigned on the basis of a normal analysis to an in plane ring vibration (R. Gieck et al, Phvs. Rev., 146. 543(1966)).

Nemanich et al (supra) have investigated in detail the line broadening in the Raman spectra of h—BN as a function of crystallite size and discussed the problems, both theoretical and experimental, with very small particles. Their data extends down to only 44 angstroms; below this the problem is one of characterizing the particle size. If one extrapolates their relationship between Raman width and particle size to the 93 cm$^{-1}$ wide band in FIG. 6(C), the particle size is $\approx$17 angstroms for the film in FIG. 6(C). Because of the extrapolation, this number may be open to question, but it is clear that the film particle size is considerably below the 40 angstrom limit of the Nemanich data where the Raman half width is approximately half that in FIG. 6(C). In contrast to the transparent films produced at low temperatures on the substrate, the BN produced on the filament, which operates at temperatures in excess of 1400° C., is an opaque white deposit of polycrystalline h—BN which gives a well developed x-ray diffraction (XRD) spectrum.

Figure 7:
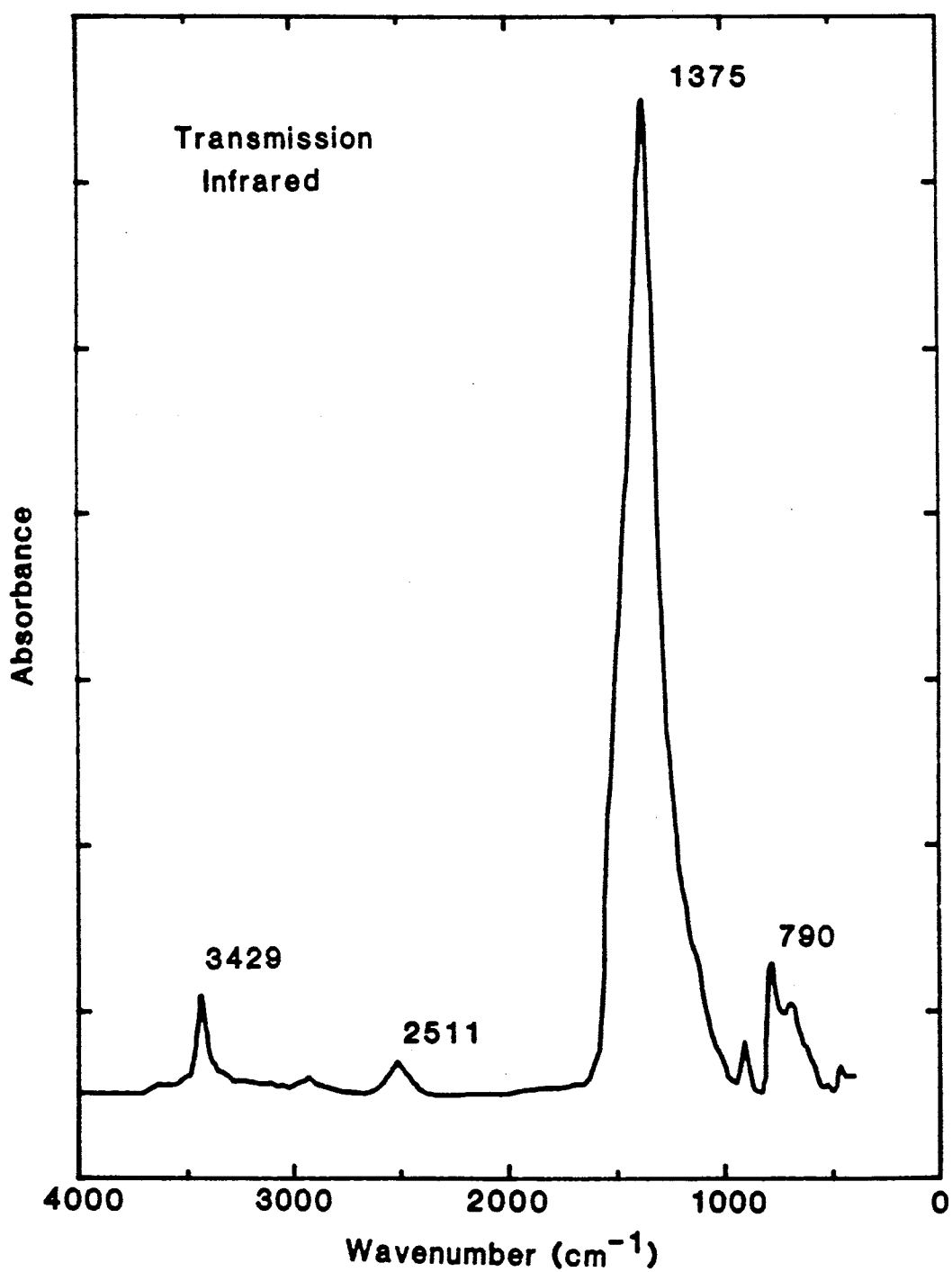
FIG. 7 shows the infrared spectrum of a BN film deposited on an outgassed KBr pellet.

Infrared spectra are consistent with the Raman assignment of h—BN. FIG. 7 contains the transmission infrared spectrum of a BN film deposited on an outgassed KBr pellet. The maximum temperature reached during deposition was $\approx$180° C. Following previous assignments for the infrared bands of h—BN films, the bands at 1375 cm$^{-1}$ and 790 cm$^{-1}$ (and the shoulder at $\approx$1520) are the characteristic bands due to the lattice vibrations, and the weak bands at 3429 cm$^{-1}$ and 2511 cm$^{-1}$, respectively, are N-H and B-H stretching vibrations. IR active bands of h—BN have been assigned on the basis of a normal mode analysis (Gieck, supra); in plane ring vibrations at 1367 cm$^{-1}$ and 1610 cm$^{-1}$, out of the plane ring vibrations at 783 cm$^{-1}$ and 828 cm$^{-1}$. The weak B-H and N-H bands indicate the presence of small amounts of hydrogen in the film, but their intensity relative to the ring vibrations is small, especially compared to their relative intensity in the precursor borazine.

The invention being thus described, it will be obvious that the same may be varied in many ways. Such variations are not to be regarded as a departure from the spirit and scope of the invention, and all such modifications as would be obvious to on skilled in the art are intended to be included within the scope of the following claims.

What is claimed is:

1. A method for coating a substrate with a boron nitride film which comprises the steps of:
   providing a substrate and a hot filament in a gas chamber; and
   introducing a borazine gas into said gas chamber so as to heat said borazine gas with said hot filament and deposit the boron nitride film on said substrate, wherein the hot filament is heated to a temperature of from about 1000° to 1800° C. and the substrate is maintained at a temperature of from 100° C. to 400° C.

2. The method according to claim 1, wherein the hot filament comprises tungsten.

3. The method according to claim 1, wherein the deposited boron nitride film has a thickness of up to 25,000 angstroms.

4. The method according to claim 1, wherein the borazine gas is introduced into said gas chamber at a pressure of from about 0.010 to 1.0 Torr.

5. The method of claim 1, wherein the substrate comprises a material selected from the group consisting of metals, semiconductors and insulators.

6. The method of claim 1, wherein the substrate is positioned at a distance of about 1 to 3 cm from the hot filament.

7. The method according to claim 1, wherein the hot filament is heated to a temperature of from about 1400° to 1600° C.

8. A method for coating a substrate with a boron nitride film which comprises the steps of:
   providing a substrate and a hot filament in a gas chamber; and
   introducing a borazine gas at a pressure of from 0.010 to 1.0 torr into said gas chamber so as to heat said borazine gas with said hot filament and deposit the boron nitride film on said substrate, wherein the hot filament is heated to a temperature of from 1000° to 1800° C., the substrate is maintained at a temperature of from 100° C. to 400° C., and the substrate is positioned at a distance of about 1 to 3 cm from the hot filament.

* * * * *